(12) United States Patent
Lin et al.

(10) Patent No.: US 8,013,648 B1
(45) Date of Patent: Sep. 6, 2011

(54) OUTPUT SLEW-RATE CONTROLLED INTERFACE AND METHOD FOR CONTROLLING THE OUTPUT SLEW-RATE OF AN INTERFACE

(75) Inventors: Lieh-Chiu Lin, Sinshih Township, Tainan County (TW); Chun-Yu Chiu, Sinshih Township, Tainan County (TW)

(73) Assignee: Himax Technologies Limited, Sinshih Township, Tainan County (TW)

( * ) Notice: Subject to any disclaimer, the term of this patent is extended or adjusted under 35 U.S.C. 154(b) by 0 days.

(21) Appl. No.: 12/835,166

(22) Filed: Jul. 13, 2010

(51) Int. Cl.
*H03K 5/12* (2006.01)
(52) U.S. Cl. .......................... 327/170; 327/172; 327/332
(58) Field of Classification Search .................. 327/3, 7, 327/170, 172, 312, 332, 389, 391–392, 399, 327/427, 431–435, 437
See application file for complete search history.

(56) References Cited

U.S. PATENT DOCUMENTS

| | | | | |
|---|---|---|---|---|
| 6,903,589 | B2 * | 6/2005 | Kim | 327/170 |
| 7,365,585 | B2 * | 4/2008 | Fort et al. | 327/170 |

* cited by examiner

*Primary Examiner* — An T Luu
(74) *Attorney, Agent, or Firm* — Thomas|Kayden (57) ABSTRACT

An output slew-rate controlled interface is provided. The output slew-rate controlled interface includes: a standard slew-rate range generating circuit, for generating at least one standard signal defining a standard slew-rate range; a slew-rate comparing circuit, coupled to the standard slew-rate range generating circuit and a load circuit coupled to the interface, for comparing a response slew-rate of a response signal from the load circuit with the standard slew-rate range and producing a comparison result; and an outputting circuit, coupled to the slew-rate comparing circuit, for adjusting an output slew-rate of an output signal according to the comparison result and outputting the output signal to the load circuit.

19 Claims, 11 Drawing Sheets

OUTPUT SLEW-RATE CONTROLLED
INTERFACE AND METHOD FOR
CONTROLLING THE OUTPUT SLEW-RATE
OF AN INTERFACE

BACKGROUND OF THE INVENTION

1. Field of the Invention

The present invention relates to slew-rate control, and in particular relates to an apparatus and method for controlling the slew-rate of an interface.

2. Description of the Related Art

Figure 1A:
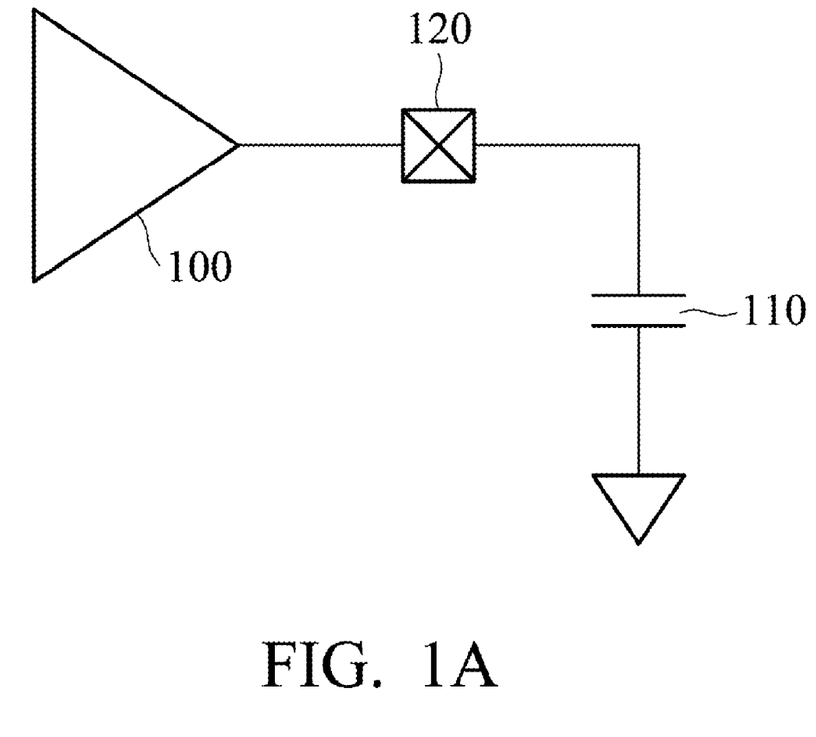
FIG. 1A is a schema showing a typical connection between two interfaces 100 and 110.

Low-power transmitters, frequently used in mobile phones, cameras and displays, are interfaces for signal communications. FIG. 1A is a schema showing a typical connection between two interfaces 100 and 110. The master interface 100 is electrically coupled to the slave interface 110 (which is regarded as a capacitance load), and transmits signals to the slave interface 110 via the pad 120. For operation speed and EMI reasons, the signals transmitted on the interfaces 100 and 110 are slew-rate controlled.

Figure 1B:
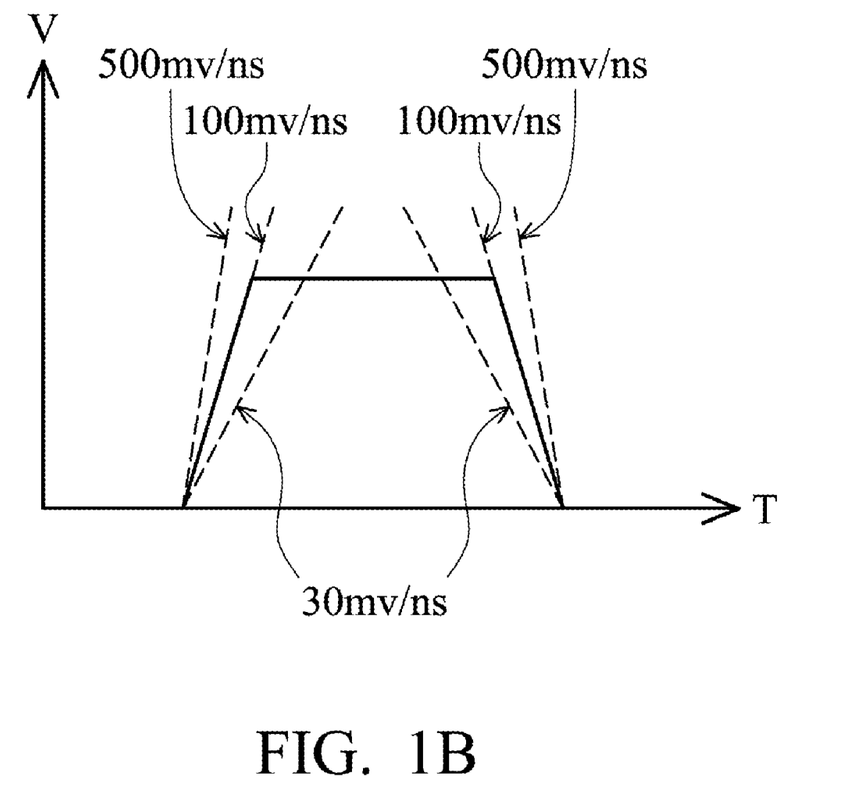
FIG. 1B illustrates an example signal, which conforms to the allowable slew-rate range limited by the MIPI D-PHY specification.

To address the explosive growth in the mobile industry, the Mobile Industry Processor Interface (MIPI) Alliance was created to define and promote open standards for interfaces. D-PHY is the physical layer specified for several of the key protocols within the MIPI family of specifications. The MIPI specification for D-PHY has defined various allowable slew-rate ranges for various capacitance loads. For example, the slew-rate shall be 30-100 mV/ns for a capacitance load of 70 pF, while the slew-rate shall be 30-500 mV/ns for a capacitance load of 0 pF. FIG. 1B illustrates an example signal, which conforms to the allowable slew-rate range limited by the MIPI D-PHY specification.

The slew-rate of a low-power transmitter can be optimized for a particular load or designed to have a moderate value for various loads during manufacturing stages. However, when actually utilized, the slew-rate of a low-power transmitter can not be optimized for all kind of loads. Therefore, it is desirable to provide a new apparatus and method for controlling the slew-rate of an interface.

BRIEF SUMMARY OF THE INVENTION

The present invention provides an output slew-rate controlled interface. The output slew-rate controlled interface comprises: a standard slew-rate range generating circuit, for generating at least one standard signal defining a standard slew-rate range; a slew-rate comparing circuit, coupled to the standard slew-rate range generating circuit and a load circuit coupled to the interface, for comparing a response slew-rate of a response signal from the load circuit with the standard slew-rate range and producing a comparison result; and an outputting circuit, coupled to the slew-rate comparing circuit, for adjusting an output slew-rate of an output signal according to the comparison result and outputting the output signal to the load circuit.

The present invention further provides a method for controlling the output slew-rate of an interface. The method for controlling the output slew-rate of an interface comprises: generating at least one standard signal defining a standard slew-rate range; comparing a response slew-rate of a response signal from a load circuit coupled to the interface with the standard slew-rate range and producing a comparison result; and adjusting an output slew-rate of an output signal according to the comparison result and outputting the output signal to the load circuit.

The apparatus and method mentioned above can control a slew-rate of an interface according to a load coupled to an interface. As a result, the slew-rate of the interface can conform to the MIPI specification for a D-PHY all the time. A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2:
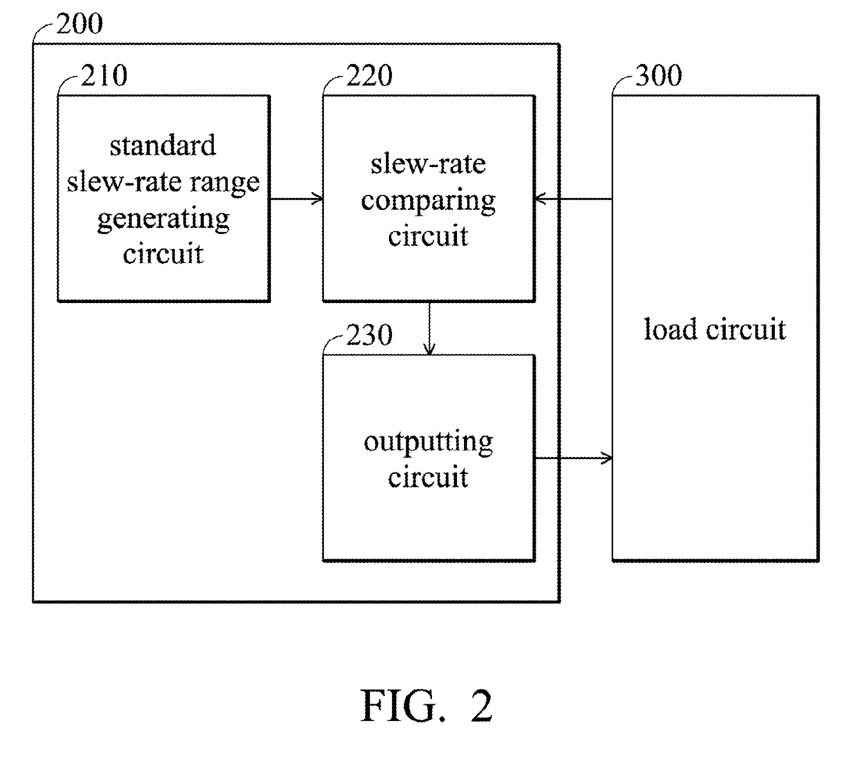
FIG. 2 is a schematic diagram of an output slew-rate controlled interface 200 according to an embodiment of the present invention.

FIG. 2 is a schematic diagram of an output slew-rate controlled interface 200 according to an embodiment of the present invention. The output slew-rate controlled interface 200 (hereinafter "interface 200") comprises a standard slew-rate range generating circuit 210, a slew-rate comparing circuit 220 and an outputting circuit 230. The interface 200 (e.g., "master"), connected to a load circuit 300 (e.g., another interface, "slave"), is used to transmit data to and receive data from the load circuit 300. In an embodiment, the "master" 200 and "slave" 300 are low-power transmission interfaces for transmitting low-power signals therebetween. By using the present invention, the output slew-rate of the output signal outputted by the interface 200 can be controlled within the limits of the MIPI specification for the D-PHY.

Before outputting the output signal, the interface 200 can output an initial signal to the load circuit 300 and then receive the response signal from the load circuit 300. The response signal is in response to the initial signal, and the interface 200 can further detect the response slew-rate from the response signal when receiving the response signal. In general circuit design, a load circuit usually pushes and pulls its voltage level with the same driving ability, which results in an output signal having the same rising and falling edges. Therefore, the interface 200 can detect the slew-rate from either the rising edge or the falling edge of the response signal. In the following, for the purpose of illustration, the present invention will detect the response signal by detecting its rising edge, but those skilled in the art will appreciate that the invention is not limited thereto. The interface 200 of the present invention can further compare the response slew-rate with a standard slew-rate range, and adjust its output slew-rate of the output signal which is outputted to the load circuit 300.

Figure 3:
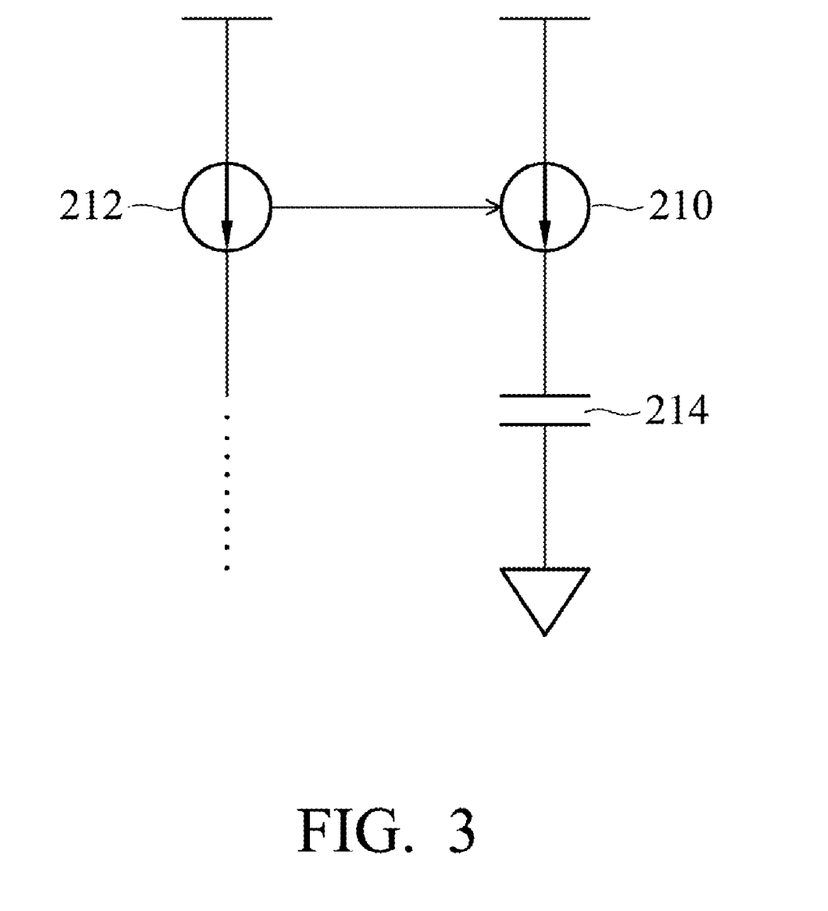
FIG. 3 is a schematic diagram of an exemplary standard slew-rate generating circuit 210 according to an embodiment of the present invention.

The standard slew-rate range generating circuit 210 of the present invention is used to generate one and more than one standard signal, and these standard signal generated is used for defining a standard slew-rate range. FIG. 3 is a schematic diagram of an exemplary standard slew-rate generating circuit 210 according to an embodiment of the present invention. In this exemplary embodiment, the standard slew-rate range generating circuit 210 comprises a constant current generator 212 and a capacitor 214. The constant current generator 112 is used to generate a constant current I. The capacitor 114 with capacitance C is coupled to the constant current generator 212 and receives the constant current I from the constant current generator 212 (for example, the received current is mirrored from the constant current generator 212). It is well known that the slew-rate SR of the standard signal generated by the standard slew-rate range generating circuit 110 is the value of the constant current I divided by the capacitance C of the capacitor. In a preferred embodiment, the standard slew-rate range generating circuit 210 generates two standard signals, and these two signals can respectively define the upper limit and the lower limit of the standard slew-rate range. In another embodiment, the standard slew-rate range generating circuit 110 may generate more than two standard signals so that several levels of the standard slew-rate range can be constructed.

The slew-rate comparing circuit 220 of the present invention is coupled to the standard slew-rate range generating circuit 210 and the load circuit 300 (which is coupled to the interface 200), as shown in FIG. 2. The slew-rate comparing circuit 220 is used to compare the response slew-rate of the response signal from the load circuit 300 with the standard slew-rate range from the slew-rate generating circuit 210 and produce a comparison result to the outputting circuit 230.

Figure 4A:
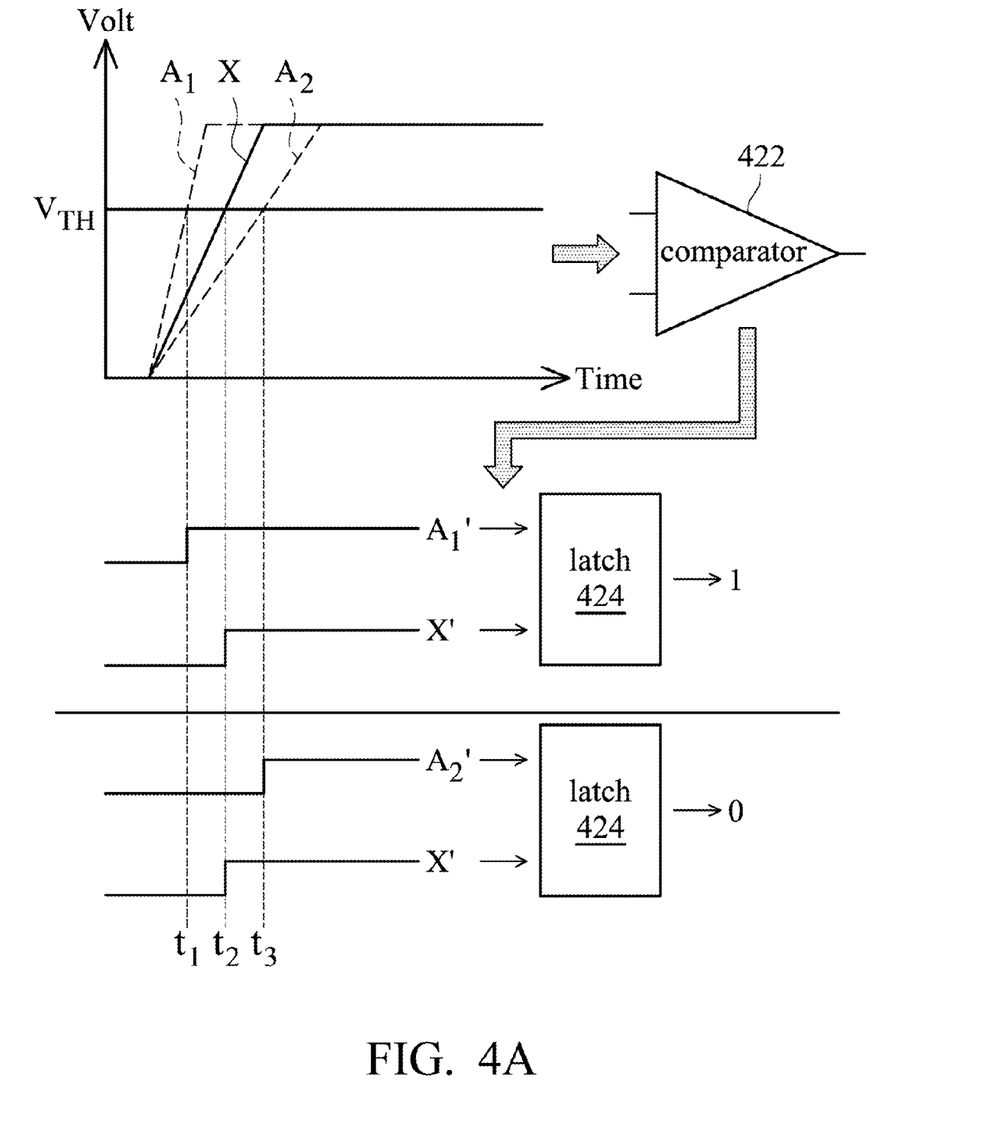
FIG. 4A shows a diagram illustrating an exemplary slew-rate comparing circuit 420 according to an embodiment of the present invention.

FIG. 4A shows a diagram illustrating an exemplary slew-rate comparing circuit 420 according to an embodiment of the present invention. The exemplary slew-rate comparing circuit 420 comprises a comparator 422 and a latch 424. In this embodiment, there is only one standard signal X, where the standard signal defines a slew rate, for example, of 70 mV/ns. The comparator 422 compares the voltage of the standard signal X at the rising edge with a threshold voltage VTH to generate a standard logic signal X'. Similarly, the comparator 422 compares the voltage of the response signal A1 (or A2) at the rising edge with the threshold voltage VTH to generate a response logic signal A1' (or A2'). The latch 424 is coupled to the comparator 422, and used for latching the logic state (i.e., the "high" state or the "low" state) of the response logic signal A1' (or A2') as the comparison result when a state transition (e.g., which goes from the "low" state to the "high" state) occurs in the standard logic signal X'. Specifically, in the case of the response signal A1, the state transition occurs in the standard logic signal X' at the time t2. Due to the high slew-rate of the response signal A1, the logic state of the response logic signal A1' becomes high at the time t1 and remains high at the time t2. Thus, the "high" state (i.e., "1") at the time t2 is latched as the comparison result in this case. In the case of the response signal A2, the state transition also occurs in the standard logic signal X' at the time t2. Due to the low slew-rate of the response signal A2, the logic state of the response logic signal A2' remains low at the time t2 before becoming high at the time t3. Thus, the "high" state (i.e., "0") at the time t3 will be latched as the comparison in this case. As can be seen from the diagram of FIG. 4A, the comparison result of value "1" indicates an excessively high slew-rate, and the driving ability for the output signal has to be decreased; while the comparison result of value "0" indicates an excessively low slew-rate, and the driving ability for the output signal has to be increased.

Figure 4B:
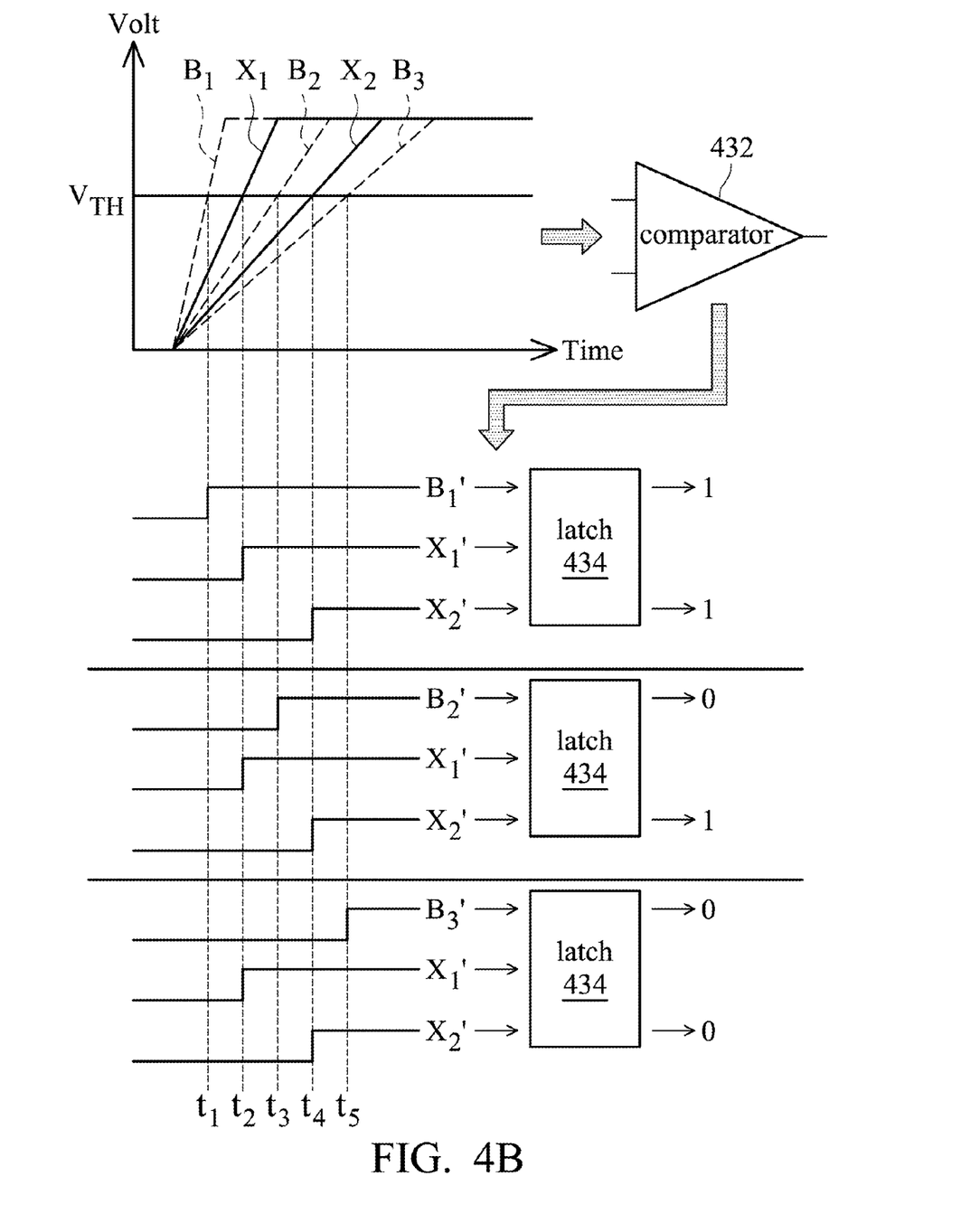
FIG. 4B shows a diagram illustrating another exemplary slew-rate comparing circuit 430 according to another embodiment of the present invention.

FIG. 4B shows a diagram illustrating another exemplary slew-rate comparing circuit 430 according to another embodiment of the present invention. Similar to the previous embodiment, the exemplary slew-rate comparing circuit 430 also comprises a comparator 432 and a latch 434. However, there are two standard signals regarded in this embodiment, where one standard signals defines the upper limit of the standard slew-rate range, for example, 90 mV/ns, and another defines the lower limit of the standard slew-rate range, for example, 40 mV/ns. In this embodiment, the comparator 432 compares the voltage of the standard signal X1 at the rising edge with a threshold voltage VTH to generate a standard logic signal X1', and compares the voltage of the standard signal X2 at the rising edge with a threshold voltage VTH to generate a standard logic signal X2'. The comparator 432 further compares the voltage of the response signal B1 (or B2 or B3) at the rising edge with the threshold voltage VTH to generate a response logic signal B1' (or B2' or B3'). The latch 434 is coupled to the comparator 432, and used for latching the logic states (i.e., the "high" state or the "low" state) of the response logic signal B1' (or B2' or B3') as the comparison result when a state transition (which here goes from the "low" state to the "high" state) occurs in one of the standard logic signals X1' and X2'.

Specifically, in the case of the response signal B1, the state transition occurs in the standard logic signal X1' at the time t2 and the state transition occurs in the standard logic signal X2' at the time t4. Due to the high slew-rate of the response signal B1, the logic state of the response logic signal B1' becomes high at the time t1 and remains high at the time t2 and t4. Thus, the "11" state at the time t2 and t4 will be latched as the comparison result in this case. In the case of the response signal B2, the state transition occurs in the standard logic signal X1' at the time t2 and the state transition occurs in the standard logic signal X2' at the time t4. Due to the moderate slew-rate of the response signal B2, the logic state of the response logic signal B2' remains low at the time t2 before becoming high at the time t3, and remains high at the time t4. Thus, the "01" state at the time t2 and t4 will be latched as the comparison result in this case. In the case of the response signal B3, the state transition occurs in the standard logic signal X1' at the time t2 and the state transition occurs in the standard logic signal X2' at the time t4. Due to the low slew-rate of the response signal B3, the logic state of the response logic signal B3' remains low at the time t2 and t4 before becoming high at the time t5. Thus, the "00" state will be latched as the comparison in this case. As can be seen from the diagram of FIG. 4B, the comparison result of value "11" indicates an excessively high slew-rate, and the driving ability for the output signal has to be decreased. Also, the comparison result of value "01" indicates a moderate slew-rate, and the driving ability for the output signal does not necessarily have to be adjusted. Meanwhile, the comparison result of value "00" indicates an excessively low slew-rate, and the driving ability for the output signal has to be increased.

In a preferred embodiment, a logic circuit (not shown) may be coupled between the slew-rate comparing circuit 430 and the outputting circuit 220, and further process the comparison results, such as "11", "01" or "00". It will be appreciated that the present invention is not limited thereto.

Figure 5A:
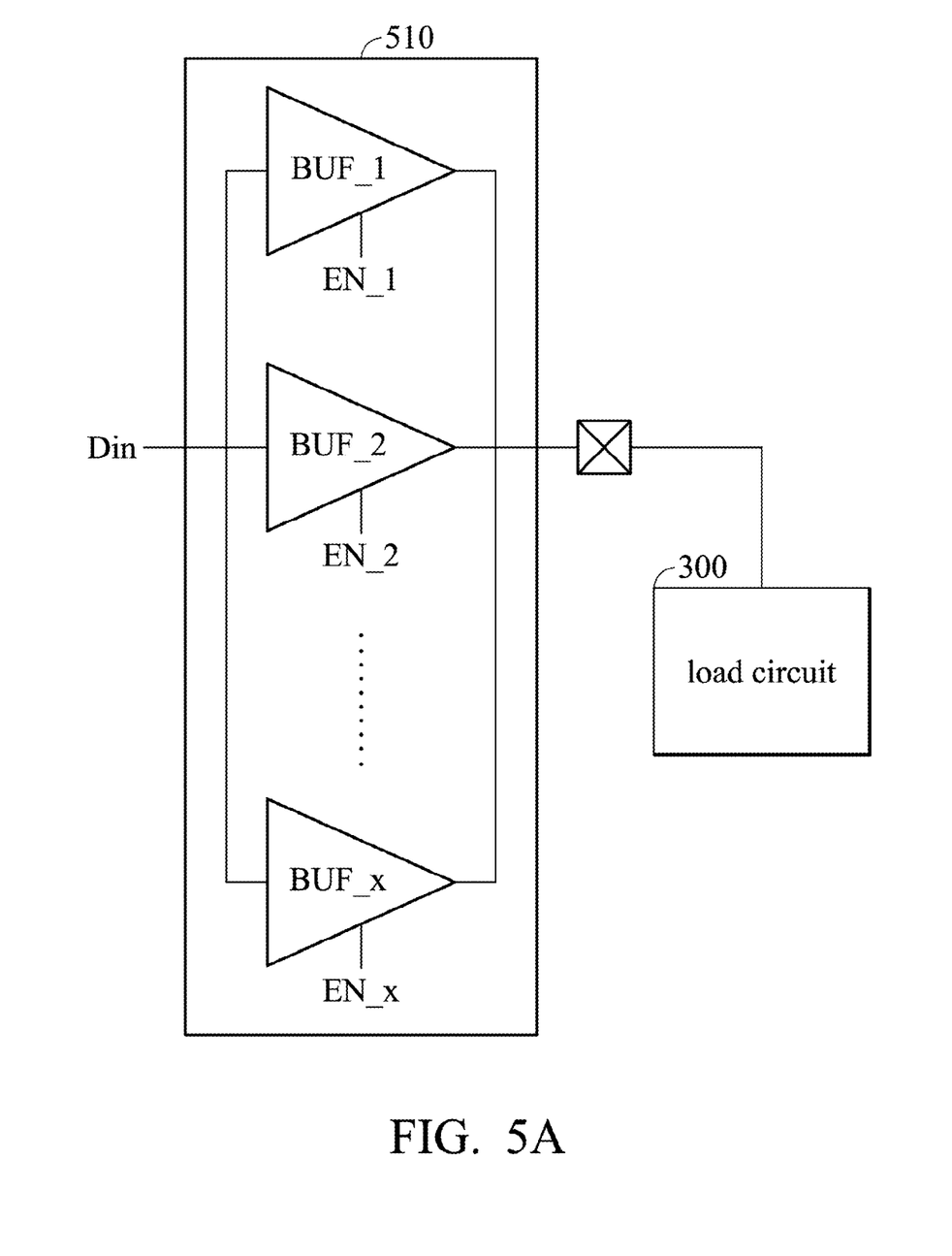
FIG. 5A shows a diagram illustrating an exemplary outputting circuit 510 according to one embodiment of the present invention.

The outputting circuit 230 of the present invention is coupled to the slew-rate comparing circuit 220, and used to adjust an output slew-rate of an output signal according to the comparison result from the slew-rate comparing circuit 220, and output the output signal with an adjusted output slew-rate to the load circuit 300. FIG. 5A shows a diagram illustrating an exemplary outputting circuit 510 according to one embodiment of the present invention. The outputting circuit 510 further comprises a plurality of the driving buffers BUF_1, BUF_2~BUF_x connected in parallel. The driving buffers of the outputting circuit 510 receive an original output signal from their input Din, adjusts the output slew-rate of the output signal, and then outputs the adjusted output signal to the load circuit 300. In this embodiment, the outputting circuit 510 adjusts the output slew-rate of the output signal by controlling the amount of the driving buffers which are turned on according to the comparison result received from EN_1~EN_x. When the comparison result indicates that the driving ability for the output signal must be increased, then the output circuit 510 turns on more driving buffers. When the comparison result indicates that the driving ability for the output signal must be decreased, then the output circuit 510 turns on less driving buffers.

Figure 5B:
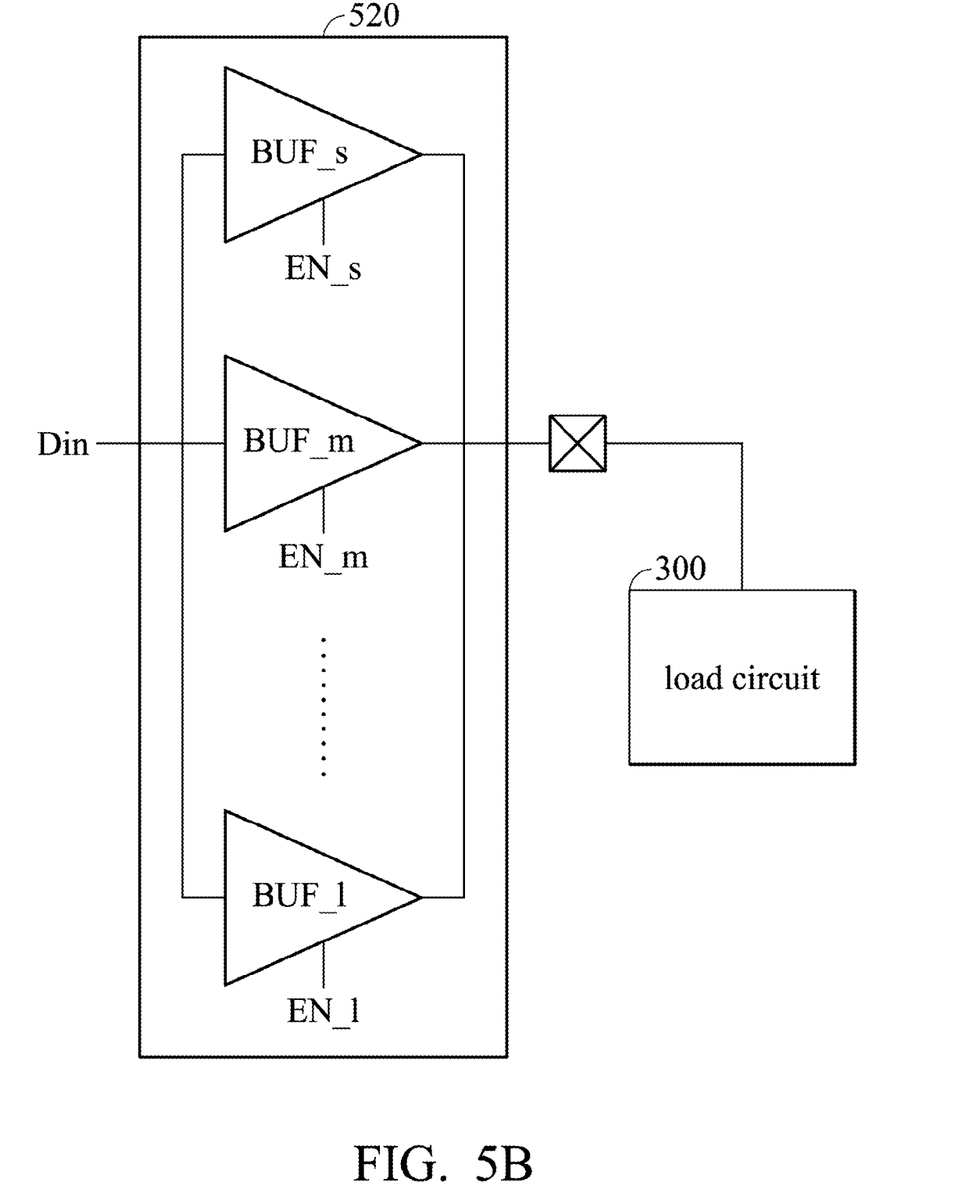
FIG. 5B shows a diagram illustrating an exemplary outputting circuit 520 according to one embodiment of the present invention.

FIG. 5B shows a diagram illustrating an exemplary outputting circuit 520 according to one embodiment of the present invention. The outputting circuit 510 further comprises, for example, three driving buffers BUF_s, BUF_m and BUF_1 connected in parallel. Similar to the previous embodiment, the driving buffers of the outputting circuit 510 receives original output signals from their input Din, respectively, adjusts the output slew-rate of the output signals, and then outputs the adjusted output signal to the load circuit 300. In this embodiment, the outputting circuit 520 adjusts the output slew-rate of the output signal by turning on one of the driving buffers which has a driving ability corresponding to the comparison result received from EN_s, EN_m and EN_1. For example, when the comparison result indicates that the driving ability for the output signal must be increased, then the output circuit 520 turns the large driving buffer BUF_1 on and turns the others off. When the comparison result indicates that the driving ability for the output signal must be maintained, then the output circuit 520 turns the moderate driving buffer on and turns the others off. When the comparison result indicates that the driving ability for the output signal must be decreased, then the output circuit 520 turns the small driving buffers on and turns the others off.

Figure 6:
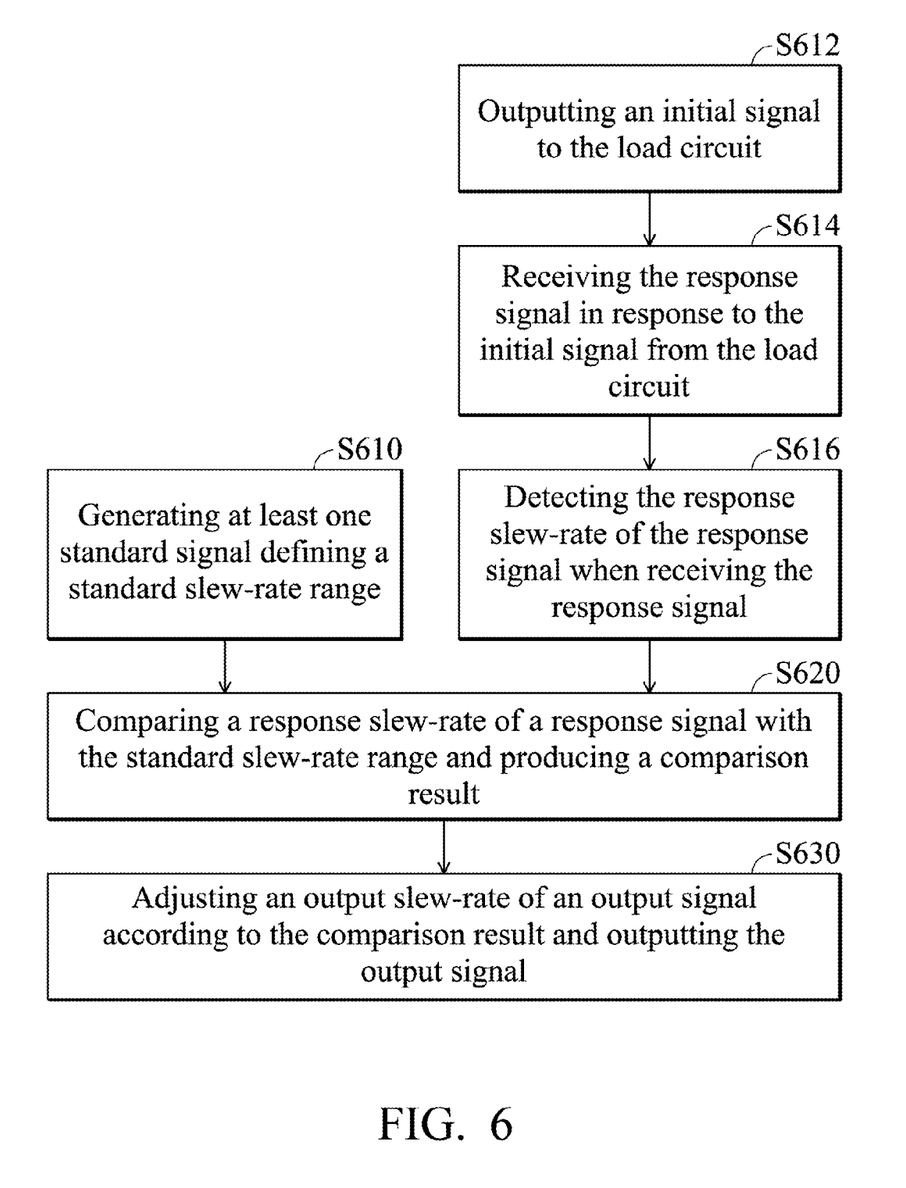
FIG. 6 is a flowchart illustrating the method for controlling the output slew-rate of an interface of the present invention.

In addition to the output slew-rate controlled interface 200 mentioned above, the present invention further provides a method for controlling the output slew-rate of an interface. FIG. 6 is a flowchart illustrating the method for controlling the output slew-rate of an interface of the present invention. The subsequent steps are now described with respect to the output slew-rate controlled interface 200 in FIGS. 2-5. The method for controlling the output slew-rate of an interface, comprises: in step S610, generating at least one standard signal defining a standard slew-rate range, for example, by the standard slew-rate range generating circuit 210; in step S620, comparing a response slew-rate of a response signal (for example, from a load circuit 300 coupled to the interface 200) with the standard slew-rate range and producing a comparison result; and in step S630, adjusting an output slew-rate of an output signal, for example, by the outputting circuit 230, according to the comparison result and outputting the output signal to the load circuit 300.

Before the step S620 of outputting the output signal, the method of the present invention further comprises: in step S612, outputting an initial signal to the load circuit; in step S614, receiving the response signal in response to the initial signal from the load circuit; and in step S616, detecting the response slew-rate, for example, from the rising edge or the falling edge, of the response signal when receiving the response signal. For example, the steps S612, S614 and S616 are preformed by the interface 200.

Figure 7:
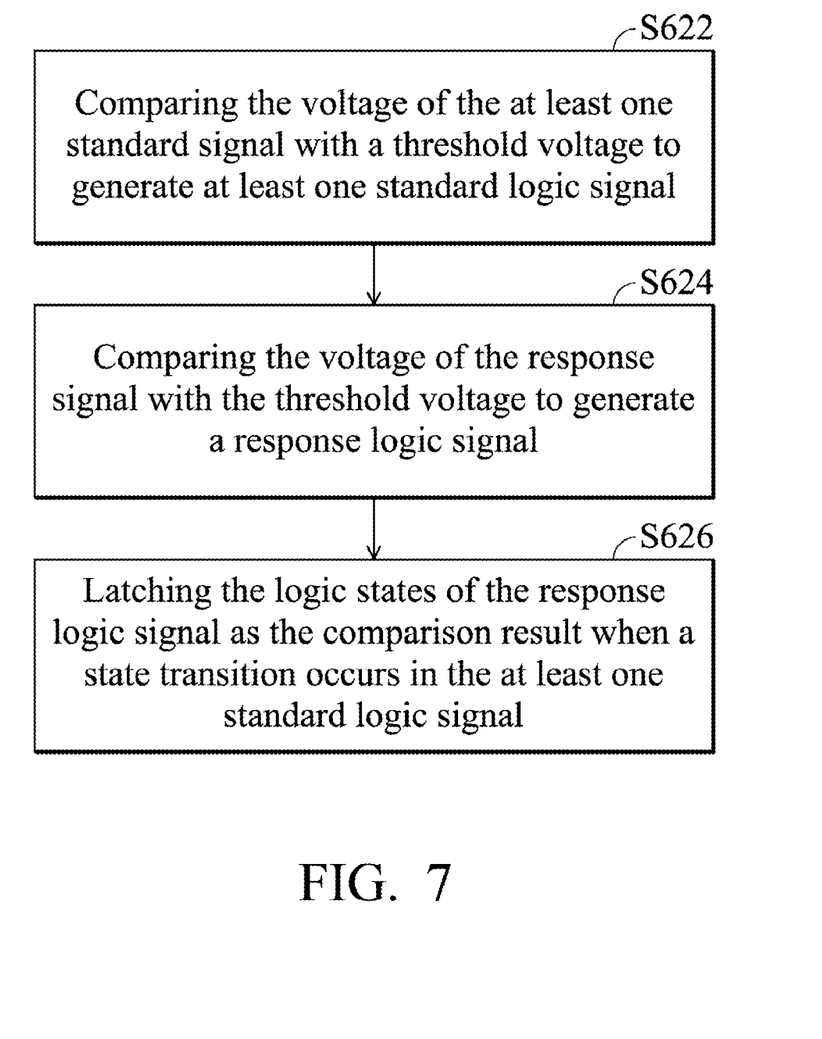
FIG. 7 is a detailed flowchart of step S620 in FIG. 6.

FIG. 7 is a detailed flowchart of step S620 in FIG. 6. The step S620 of comparing the response slew-rate with the standard slew-rate range further comprises: in step S622, comparing the voltage of the at least one standard signal with a threshold voltage (for example, VTH in FIG. 4A) to generate at least one standard logic signal; in step S624, comparing the voltage of the response signal with the threshold voltage (VTH) to generate a response logic signal; and in step S626, latching the logic states of the response logic signal as the comparison result when a state transition occurs in the at least one standard logic signal. The comparing steps S622, S624 and S626 are similar to those described above in respect to FIGS. 4A and 4*b*; therefore, detailed illustration has been omitted for simplification.

Figure 8:
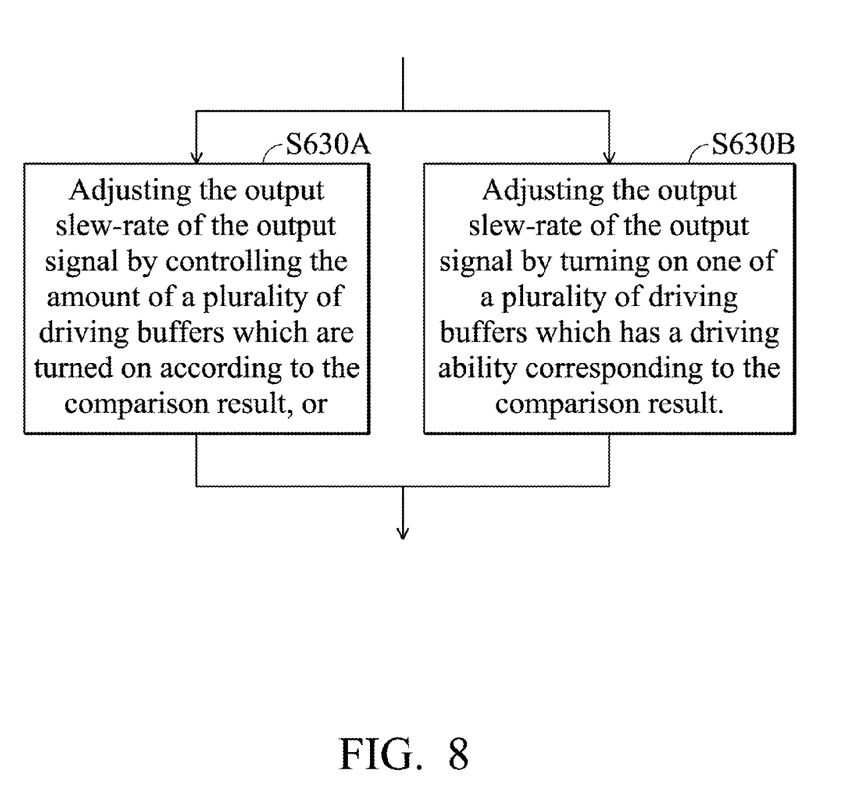
FIG. 8 is a detailed flowchart of step S630 in FIG. 6.

FIG. 8 is a detailed flowchart of step S630 in FIG. 6. The step S630 of adjusting the output slew-rate of the output signal according to the comparison result further comprises: in step S630A, adjusting the output slew-rate of the output signal by controlling the amount of a plurality of driving buffers which are turned on according to the comparison result, or in step S630B, adjusting the output slew-rate of the output signal by turning on one of a plurality of driving buffers which has a driving ability corresponding to the comparison result. The adjusting steps S630A and S630*b* are similar to those described above in respect to FIGS. 5A and 5*b*; therefore, detailed illustration has been omitted for simplification.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An output slew-rate controlled interface, comprising:
   a standard slew-rate range generating circuit, for generating at least one standard signal defining a standard slew-rate range;
   a slew-rate comparing circuit, coupled to the standard slew-rate range generating circuit and a load circuit coupled to the interface, for comparing a response slew-rate of a response signal from the load circuit with the standard slew-rate range and producing a comparison result; and
   an outputting circuit, coupled to the slew-rate comparing circuit, for adjusting an output slew-rate of an output signal according to the comparison result and outputting the output signal to the load circuit.

2. The output slew-rate controlled interface as claimed in claim 1, wherein the interface outputs an initial signal to the load circuit and receives the response signal in response to the initial signal from the load circuit, before outputting the output signal.

3. The output slew-rate controlled interface as claimed in claim 1, wherein interface further detects the response slew-rate from the response signal when receiving the response signal.

4. The output slew-rate controlled interface as claimed in claim 3, wherein the interface detects the response slew-rate from the rising edge of the response signal.

5. The output slew-rate controlled interface as claimed in claim 3, wherein the interface detects the response slew-rate from the falling edge of the response signal.

6. The output slew-rate controlled interface as claimed in claim 1, wherein the interface is a low-power transmission interface for transmitting a low-power signal.

7. The output slew-rate controlled interface as claimed in claim 1, wherein the standard slew-rate range generating circuit comprises:
   a constant current generator for generating a constant current; and
   a capacitor, coupled to the constant current generator, for receiving the constant current.

8. The output slew-rate controlled interface as claimed in claim 1, wherein the slew-rate comparing circuit comprises:
   at least one comparator for comparing the voltage of the at least one standard signal with a threshold voltage to generate at least one standard logic signal, and comparing the voltage of the response signal with the threshold voltage to generate a response logic signal; and
   a latch, coupled to the at least one comparator, for latching the logic states of the response logic signal as the comparison result when a state transition occurs in the at least one standard logic signal.

9. The output slew-rate controlled interface as claimed in claim 1, wherein the outputting circuit further comprises a plurality of the driving buffers connected in parallel.

10. The output slew-rate controlled interface as claimed in claim 9, wherein the outputting circuit adjusts the output slew-rate of the output signal by controlling the amount of the driving buffers which are turned on according to the comparison result.

11. The output slew-rate controlled interface as claimed in claim 9, wherein the outputting circuit adjusts the output slew-rate of the output signal by turning on one of the driving buffers which has a driving ability corresponding to the comparison result.

12. A method for controlling the output slew-rate of an interface, comprising:
   generating at least one standard signal defining a standard slew-rate range;
   comparing a response slew-rate of a response signal from a load circuit coupled to the interface with the standard slew-rate range and producing a comparison result; and
   adjusting an output slew-rate of an output signal according to the comparison result and outputting the output signal to the load circuit.

13. The method as claimed in claim 12, further comprising:
   outputting an initial signal to the load circuit; and
   receiving the response signal in response to the initial signal from the load circuit before outputting the output signal.

14. The method as claimed in claim 13, further comprising:
   detecting the response slew-rate from the response signal when receiving the response signal.

15. The method as claimed in claim 14, further comprising:
   detecting the response slew-rate from the rising edge of the response signal.

16. The method as claimed in claim 14, further comprising:
   detecting the response slew-rate from the falling edge of the response signal.

17. The method as claimed in claim 12, wherein the step of comparing the response slew-rate with the standard slew-rate range further comprises:
   comparing the voltage of the at least one standard signal with a threshold voltage to generate at least one standard logic signal;
   comparing the voltage of the response signal with the threshold voltage to generate a response logic signal; and
   latching the logic states of the response logic signal as the comparison result when a state transition occurs in the at least one standard logic signal.

18. The method as claimed in claim 12, wherein the step of adjusting the output slew-rate of the output signal according to the comparison result further comprises:
   adjusting the output slew-rate of the output signal by controlling the amount of a plurality of driving buffers which are turned on according to the comparison result.

19. The method as claimed in claim 12, wherein the step of adjusting the output slew-rate of the output signal according to the comparison result further comprises:
   adjusting the output slew-rate of the output signal by turning on one of a plurality of driving buffers which has a driving ability corresponding to the comparison result.

* * * * *